United States Patent [19]

Iguchi et al.

[11] Patent Number: 5,886,514
[45] Date of Patent: Mar. 23, 1999

[54] PIEZOELECTRIC TRANSFORMER DRIVING CURCUIT AND METHOD CAPABLE OF STABILIZING LOAD CURRENT

[75] Inventors: Kouichi Iguchi; Hiroshi Sasaki, both of Tokyo, Japan

[73] Assignee: NEC Corporation, Tokyo, Japan

[21] Appl. No.: 982,453

[22] Filed: Dec. 2, 1997

[30] Foreign Application Priority Data

Dec. 3, 1996 [JP] Japan .................................. 8-323211

[51] Int. Cl.$^6$ .............................. G05F 5/00; H05B 37/02
[52] U.S. Cl. .......................... 323/299; 363/78; 310/318; 315/224
[58] Field of Search ............................ 363/78; 323/299; 310/318, 359, 366; 315/224

[56] References Cited

U.S. PATENT DOCUMENTS

| | | | |
|---|---|---|---|
| 5,548,189 | 8/1996 | Williams | 315/224 |
| 5,555,168 | 9/1996 | Ferrario | 323/299 |
| 5,654,605 | 8/1997 | Kawashima | 310/318 |
| 5,684,392 | 11/1997 | Chang et al. | 323/299 |
| 5,705,877 | 1/1998 | Shimada | 310/318 |
| 5,731,652 | 3/1998 | Shimada | 310/316 |
| 5,739,679 | 4/1998 | Takehara et al. | 323/299 |
| 5,796,213 | 8/1998 | Kawasaki | 315/224 |

FOREIGN PATENT DOCUMENTS

| | | |
|---|---|---|
| 5-176530 | 7/1993 | Japan . |
| 7-147771 | 6/1995 | Japan . |
| 8-107678 | 4/1996 | Japan . |
| 8-275553 | 10/1996 | Japan . |

*Primary Examiner*—Stuart N. Hecker
*Attorney, Agent, or Firm*—Sughrue, Mion, Zinn, Macpeak & Seas, PLLC

[57] ABSTRACT

In a piezoelectric transformer driving circuit which comprises a boosting circuit (2) for boosting an input direct current voltage, a piezoelectric transformer (3), a current voltage converting circuit for converting a load alternating current which flows in the load (9), and a rectifier circuit (5), an input voltage detecting and comparing circuit (10) compares the input direct current voltage with a minimum voltage which is determined by a setting value of the load alternating current to produce a first voltage having a high level when the input direct current voltage is lower than the minimum voltage and to produce a second voltage having a low level when the input direct current voltage is higher than the minimum voltage. A reference voltage producing circuit (6a) produces one of first and second reference voltages in response to one of the first and second voltages. A main voltage comparing circuit (7) compares a rectified direct current voltage from the rectifier circuit with one of the first and second reference voltages to produce one of primary and secondary voltages. A frequency scanning oscillator (8) determines, in response to one of the primary and secondary voltages, a scanning direction of a driving frequency of a driving pulse signal which is supplied to the boosting circuit to supply the driving pulse signal to the boosting circuit. The input voltage detecting and comparing circuit may supply the first and second voltages to the current voltage converting circuit instead of the reference voltage producing circuit. In this event, the reference voltage producing circuit produces and supplies a reference voltage to the main voltage comparing circuit.

4 Claims, 14 Drawing Sheets

PIEZOELECTRIC TRANSFORMER DRIVING CURCUIT AND METHOD CAPABLE OF STABILIZING LOAD CURRENT

BACKGROUND OF THE INVENTION

This invention relates to a piezoelectric transformer driving circuit and method which boosts an alternating current voltage to produce and supply a boosted alternating current voltage to a load.

DESCRIPTION OF THE RELATED ART

Conventional piezoelectric transformer driving circuits are described in Japanese Unexamined Patent Prepublication (koukai) No. 176530/1993, No. 147771/1995, No. 107678/1996, and No. 275553/1996.

In the manner which will later be described more in detail, a conventional piezoelectric transformer driving circuit comprises a direct current power source, a boosting circuit, a piezoelectric transformer, a current voltage converting circuit, a rectifier circuit, a reference voltage producing circuit, a main voltage comparing circuit, and a frequency scanning oscillator.

The boosting circuit is supplied with an input direct current voltage from the direct current power source. The boosting circuit boosts the input direct current voltage to produce a boosted alternating current voltage. The boosting circuit supplies the boosted alternating current voltage to a primary electrode of the piezoelectric transformer. Also, the piezoelectric transformer is supplied with a driving pulse signal from the frequency scanning oscillator through the boosting circuit. The piezoelectric transformer produces, in a secondary electrode, a transformed alternating current voltage in response to the driving pulse signal from the frequency scanning oscillator. The piezoelectric transformer supplies the transformed alternating current voltage to the load.

The current voltage converting circuit, the rectifier circuit, the reference voltage producing circuit, the main voltage comparing circuit, and the frequency scanning oscillator make a load alternating current of the load stabile.

However, when, in the above conventional piezoelectric transformer driving circuit, the direct current power source is consumable, the input direct current voltage which makes the load flow a setting value of the load alternating current falls short.

SUMMARY OF THE INVENTION

It is therefore an object of this invention to provide piezoelectric transformer driving circuit and method which are capable of stabilizing a load alternating current even when the input direct current voltage falls short.

Other objects of this invention will become clear as the description proceeds.

According to a first aspect of this invention, there is provided a piezoelectric transformer driving circuit comprising: a boosting circuit supplied with an input direct current voltage for boosting the input direct current voltage to produce a boosted alternating current voltage; a piezoelectric transformer supplied with the boosted alternating current voltage from the boosting circuit for supplying a transformed alternating current voltage to a load; a current voltage converting circuit for converting a load alternating current which flows in the load to produce a converted alternating current voltage; a rectifier circuit for rectifying the converted alternating current voltage from the current voltage converting circuit to produce a rectified direct current voltage; an input voltage detecting circuit for detecting the input direct current voltage; an input voltage comparing circuit for comparing the input direct current voltage with a minimum voltage which is determined by a setting value of the load alternating current to produce a first voltage having a high level when the input direct current voltage is lower than the minimum voltage and to produce a second voltage having a low level when the input direct current voltage is higher than the minimum voltage; a reference voltage producing circuit for producing a first reference voltage having a high level when the reference voltage producing circuit is supplied with the second voltage from the input voltage comparing circuit and for producing a second reference voltage having a low level when the reference voltage producing circuit is supplied with the first voltage from the input voltage comparing circuit; a main voltage comparing circuit for comparing the rectified direct current voltage from the rectifier circuit with one of the first and second reference voltages from the reference voltage producing circuit to produce a primary voltage having a high level when the rectified direct current voltage is lower than the one of the first and second reference voltages and to produce a secondary voltage having a low level when the rectified direct current voltage is higher than the one of the first and second reference voltages; and a frequency scanning oscillator for determining, in response to one of the primary and secondary voltages from the main voltage comparing circuit, a scanning direction of a driving frequency of a driving pulse signal which is supplied to the boosting circuit to supply the driving pulse signal to the boosting circuit.

According to a second aspect of this invention, there is provided a piezoelectric transformer driving circuit comprising: a boosting circuit supplied with an input direct current voltage for boosting the input direct current voltage to produce a boosted alternating current voltage; a piezoelectric transformer supplied with the boosted alternating current voltage from the boosting circuit for supplying a transformed alternating current voltage to a load; a current voltage converting circuit for converting a load alternating current which flows in the load to produce a converted alternating current voltage; a rectifier circuit for rectifying the converted alternating current voltage from the current voltage converting circuit to produce a rectified direct current voltage; an input voltage detecting circuit for detecting the input direct current voltage; a reference voltage producing circuit for producing a first reference voltage having a high level when the input direct current voltage is higher than a minimum voltage which is determined by a setting value of the load alternating current and for producing a second reference voltage having a low level when the input direct current voltage is lower than the minimum voltage; a main voltage comparing circuit for comparing the rectified direct current voltage from the rectifier circuit with one of the first and second reference voltages from the reference voltage producing circuit to produce a primary voltage having a high level when the rectified direct current voltage is lower than the one of the first and second reference voltages and to produce a secondary voltage having a low level when the rectified direct current voltage is higher than the one of the first and second reference voltages; and a frequency scanning oscillator for determining, in response to one of the primary and secondary voltages from the main voltage comparing circuit, a scanning direction of a driving frequency of a driving pulse signal which is supplied to the boosting circuit to supply the driving pulse signal to the boosting circuit.

According to a third aspect of this invention, there is provided a piezoelectric transformer driving circuit comprising: a boosting circuit supplied with an input direct current voltage for boosting the input direct current voltage to produce a boosted alternating current voltage; a piezoelectric transformer supplied with the boosted alternating current voltage from the boosting circuit for supplying a transformed alternating current voltage to a load; an input voltage detecting circuit for detecting the input direct current voltage; an input voltage comparing circuit for comparing the input direct current voltage with a minimum voltage which is determined by a setting value of the load alternating current to produce a first voltage having a high level when the input direct current voltage is higher than the minimum voltage and to produce a second voltage having a low level when the input direct current voltage is lower than the minimum voltage; a current voltage converting circuit for converting a load alternating current which flows in the load to produce a first converted alternating current voltage having a high level when the current voltage converting circuit is supplied with the second voltage from the input voltage comparing circuit and for converting the load alternating current to produce a second converted alternating current voltage having a low level when the current voltage converting circuit is supplied with the first voltage from the input voltage comparing circuit; a rectifier circuit for rectifying one of the first and second converted alternating current voltages from the current voltage converting circuit to produce one of first and second rectified direct current voltages, the first rectified direct current voltage having a high level, the second rectified direct current voltage having a low level; a reference voltage producing circuit for producing a reference voltage; a main voltage comparing circuit for comparing the one of the first and second rectified direct current voltages from the rectifier circuit with the reference voltage from the reference voltage producing circuit to produce a primary voltage having a high level when the one of the first and second rectified direct current voltages is lower than the reference voltage and to produce a secondary voltage having a low level when the one of the first and second rectified direct current voltages is higher than the reference voltages; and a frequency scanning oscillator for determining, in response to one of the primary and secondary voltages from the main voltage comparing circuit, a scanning direction of a driving frequency of a driving pulse signal which is supplied to the boosting circuit to supply the driving pulse signal to the boosting circuit.

According to a fourth aspect of this invention, there is provided a piezoelectric transformer driving method in which a piezoelectric transformer supplies a transformed alternating current voltage to a load to control a load alternating current in the load, the piezoelectric transformer driving method comprising: a step of detecting an input direct current voltage which is supplied to a boosting circuit which supplies a boosted alternating current voltage to the piezoelectric transformer; and a step of decreasing a setting value of the load alternating current when the input direct current voltage is lower than a minimum voltage which is determined by the setting value of the load alternating current.

DESCRIPTION OF THE PREFERRED EMBODIMENTS

Referring to FIGS. 1 to 8, a conventional piezoelectric transformer driving circuit will first be described for a better understanding of this invention.

Figure 1:
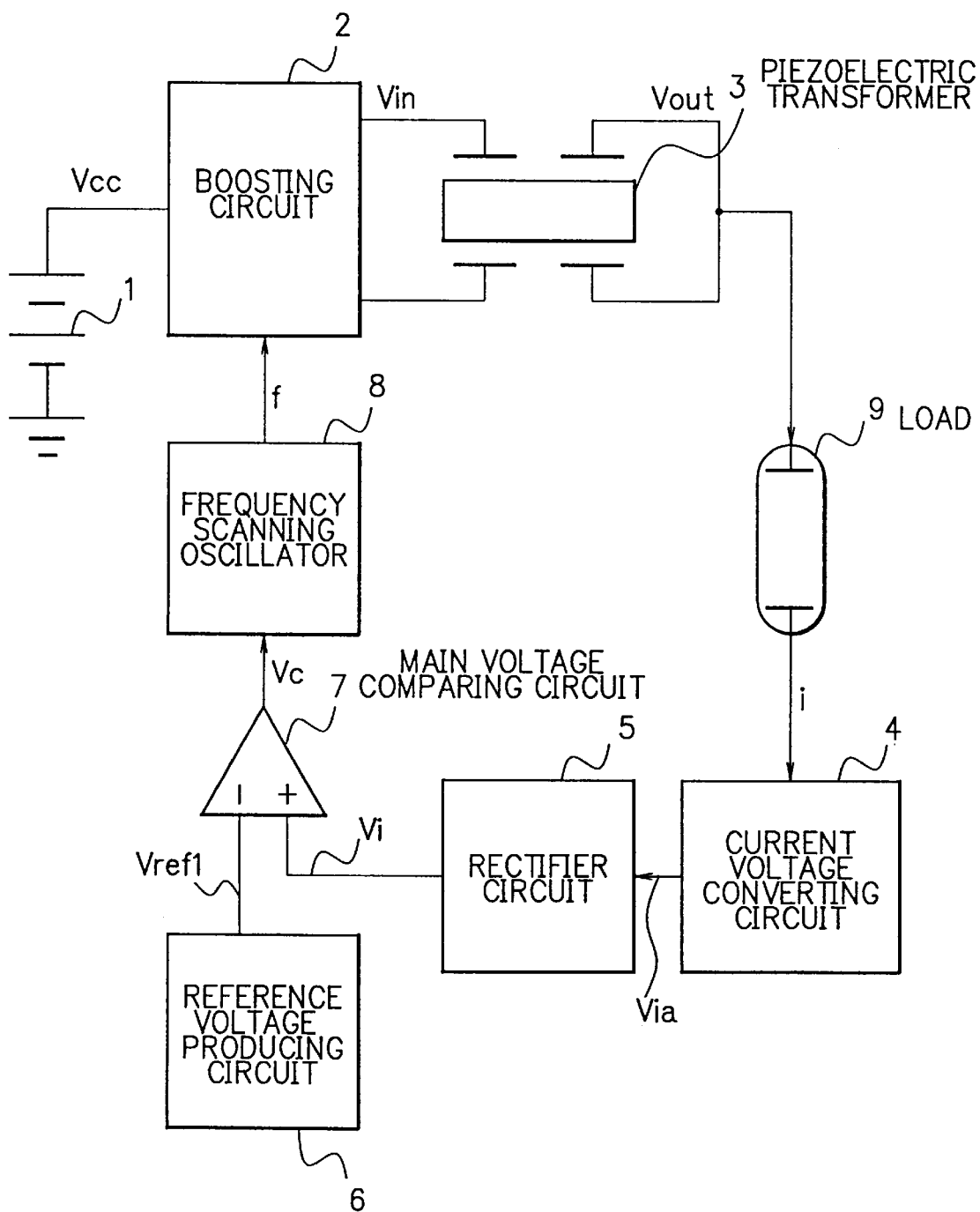
FIG. 1 is a block diagram of a conventional piezoelectric transformer driving circuit.

In FIG. 1, the conventional piezoelectric transformer driving circuit comprises a direct current power source 1, a boosting circuit 2, a piezoelectric transformer 3, a current voltage converting circuit 4, a rectifier circuit 5, a reference voltage producing circuit 6, a main voltage comparing circuit 7, and a frequency scanning oscillator 8. The boosting circuit 2 is connected to the direct current power source 1. The piezoelectric transformer 3 is connected between the boosting circuit 2 and a load 9. The current voltage converting circuit 4 is connected to the load 9. The rectifier circuit 5 is connected to the current voltage converting circuit 4. The current voltage converting circuit 4 and the reference voltage producing circuit 6 are connected to two input terminals of the main voltage comparing circuit 7. An output terminal of the main voltage comparing circuit 7 is connected to the frequency scanning oscillator 8. An output terminal of the frequency scanning oscillator 8 is connected to the boosting circuit 2.

The boosting circuit 2 is supplied with an input direct current voltage Vcc from the direct current power source 1. The boosting circuit 2 boosts the input direct current voltage Vcc to produce a boosted alternating current voltage Vin. The boosting circuit 2 supplies the boosted alternating current voltage Vin to a primary electrode of the piezoelectric transformer 3. Also, the piezoelectric transformer 3 is supplied with a driving pulse signal from the frequency scanning oscillator 8 through the boosting circuit 2. The piezoelectric transformer 3 produces, in a secondary electrode, a transformed alternating current voltage Vout in response to the driving pulse signal from the frequency scanning oscillator 8. The transformed alternating current voltage Vout has a voltage which is equal to Av times as much as the boosted alternating current voltage Vin. The piezoelectric transformer 3 supplies the transformed alternating current voltage Vout to the load 9.

The current voltage converting circuit 4 converts a load alternating current i which flows in the load 9 to produce a converted alternating current voltage Via. The rectifier circuit 5 rectifies the converted alternating current voltage Via from the current voltage converting circuit 4 to produce a rectified direct current voltage Vi. The reference voltage producing circuit 6 produces a reference voltage Vref1.

The main voltage comparing circuit 7 is supplied with the rectified direct current voltage Vi from the rectifier circuit 5 and the reference voltage Vref1 from the reference voltage producing circuit 6. The main voltage comparing circuit 7 compares the rectified direct current voltage Vi with the reference voltage Vref1 to produce a difference voltage Vc. The difference voltage Vc has a high level when the rectified direct current voltage Vi is lower than the reference voltage Vref1. Also, the difference voltage Vc has a low level when the rectified direct current voltage Vi is higher than the reference voltage Vref1.

Figure 2:
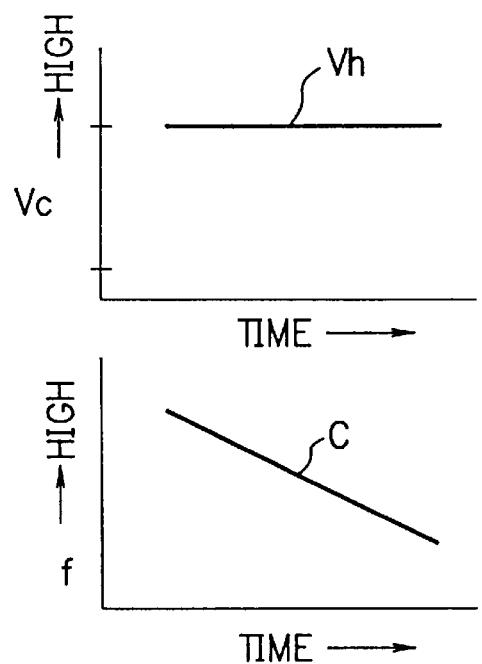
FIG. 2 is a first view for use in describing an operation of the conventional piezoelectric transformer driving circuit illustrated in FIG. 1.
Figure 3:
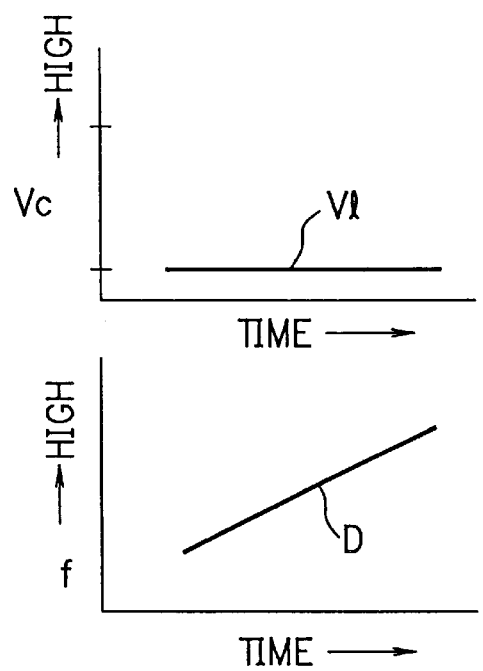
FIG. 3 is a second view for use in describing the operation of the conventional piezoelectric transformer driving circuit illustrated in FIG. 1.
Figure 4:
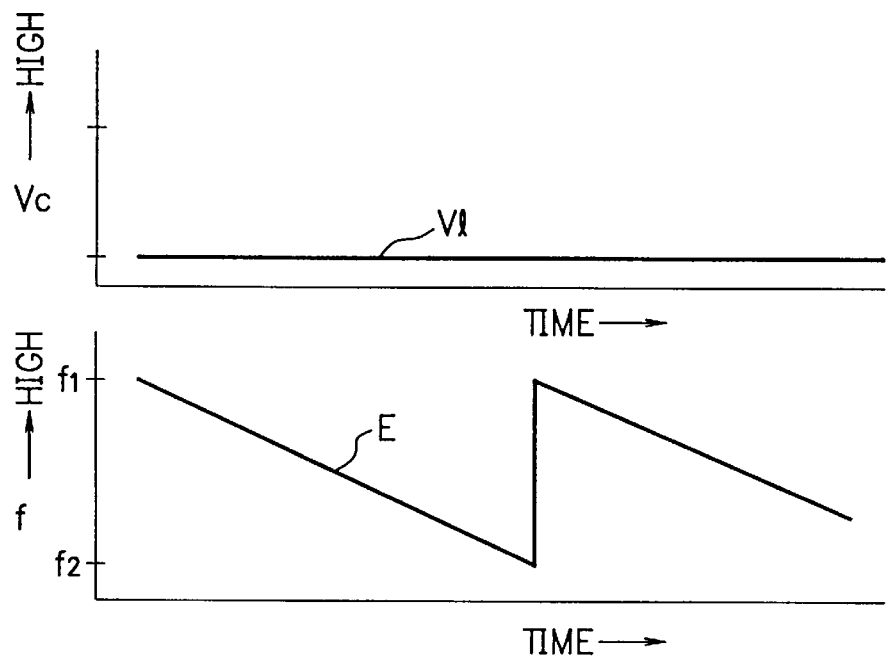
FIG. 4 is a third view for use in describing the operation of the conventional piezoelectric transformer driving circuit illustrated in FIG. 1.

The frequency scanning oscillator 8 is supplied with the difference voltage Vc from the main voltage comparing circuit 7. The frequency scanning oscillator 8 determines, in response to the high and low level of the difference voltage Vc, a scanning direction of a driving frequency of the driving pulse signal which is supplied to the boosting circuit 2 to supply the driving pulse signal to the boosting circuit 2. As shown in FIG. 2, when the difference voltage Vc has the high level Vh, the frequency scanning oscillator 8 supplies the driving pulse signal having the driving frequency f to the boosting circuit 2 while the frequency scanning oscillator 8 scans, at a first predetermined rate, the driving frequency f in a low direction as shown by a line C in FIG. 2. As shown in FIG. 3, when the difference voltage Vc has the low level V1, the frequency scanning oscillator 8 supplies the driving pulse signal having the driving frequency f to the boosting circuit 2 while the frequency scanning oscillator 8 scans, at a second predetermined rate, the driving frequency f in a high direction as shown by a line D in FIG. 3. Also, as shown in FIG. 4, when the difference voltage Vc is held at the low level V1, as shown by a line E in FIG. 4, the frequency scanning oscillator 8 resets to an upper limit value f1 when the driving frequency f reaches to a lower limit value f2 and thereafter repeats this operation.

Figure 5:
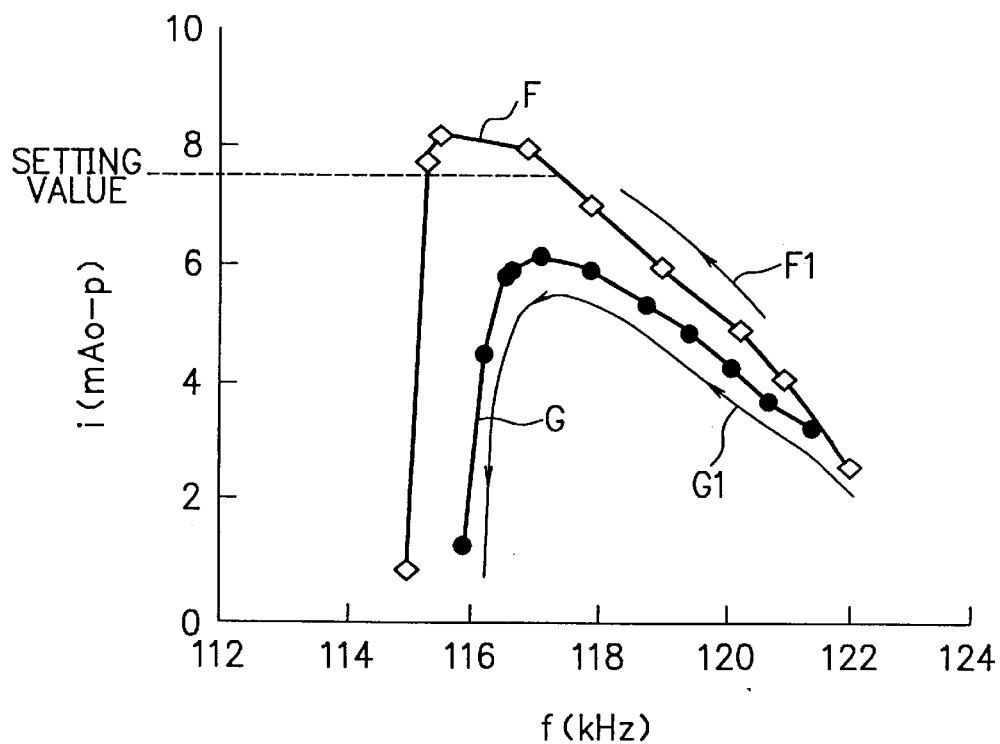
FIG. 5 is a fourth view for use in describing the operation of the conventional piezoelectric transformer driving circuit illustrated in FIG. 1.

In the conventional piezoelectric transformer driving circuit, as shown in FIG. 5, the frequency scanning oscillator 8 is set to scan the driving frequency f in a low direction from a high value in order to stabilize the load alternating current i as shown by arrows F1 and G1. In FIG. 5, a line K represents the load alternating current i when the input direct current voltage Vcc is higher than a minimum voltage Vcc1 which is determined by a setting value of the load alternating current i. Also, in FIG. 5, a line G represents the load alternating current i when the input direct current voltage Vcc is lower than the minimum voltage Vcc1. The main voltage comparing circuit 7 compares the rectified direct current voltage Vi which is obtained by rectifying the load alternating current i with the reference voltage Vref1 to produce the difference voltage Vc. The main voltage comparing circuit 7 produces the difference voltage Vc having the high level when the rectified direct current voltage Vi is lower than the reference voltage Vref1. When the difference voltage Vc has the high level, the frequency scanning oscillator 8 supplies the driving pulse signal having the driving frequency f to the boosting circuit 2 while the frequency scanning oscillator 8 scans, at the first predetermined rate, the driving frequency f in the low direction from the high value. When the rectified direct current voltage Vi is equal to the reference voltage Vref1, the frequency scanning oscillator 8 inverts the scanning direction, namely, the frequency scanning oscillator 8 supplies the driving pulse signal having the driving frequency f to the boosting circuit 2 while the frequency scanning oscillator 8 scans the driving frequency f in a high direction from the low value. Thereafter, the frequency scanning oscillator 8 repeats this operation to make the load alternating current i reach at a setting value.

Also, when the rectified direct current voltage Vi is equal to the reference voltage Vref1 even when the frequency scanning oscillator 8 scans the driving frequency f to reach at the lower limit value f2, the frequency scanning oscillator 8 inverts the scanning direction, namely, the frequency scanning oscillator 8 supplies the driving pulse signal having the driving frequency f to the boosting circuit 2 while the frequency scanning oscillator 8 scans the driving frequency f in the high direction from the low value. Thereafter, the frequency scanning oscillator 8 inverts the scanning direction when the driving frequency reaches at the upper limit value f1, namely, the frequency scanning oscillator 8 supplies the driving pulse signal having the driving frequency f to the boosting circuit 2 while the frequency scanning oscillator 8 scans the driving frequency f in the low direction so that the load alternating current i reaches at the setting value.

Here, when it is hardly possible for the load alternating current i to flow in case that an impedance of the load 9 such as a cold cathode tube is remarkably high directly after supply of the power source, the above mentioned scanning operation is repeated. Also, when the input direct current voltage Vcc which is inputted to the boosting circuit 2 is lower than the minimum voltage Vcc1 which is determined by the setting value of the load alternating current i, the boosted alternating current voltage Vin which is inputted to the primary electrode of the piezoelectric transformer 3 from the boosting circuit 2 is lower than a minimum voltage Vin1 of an input voltage of the primary side. As a result, since the setting value of the load alternating current i of the piezoelectric transformer 3 is not obtained by the transformed alternating current voltage Vout which is transformed by the piezoelectric transformer 3, the above mentioned scanning operation is repeated. Therefore, as shown by lines L and M in FIG. 7, the load alternating current i is changed in response to the driving frequency f. In this event, in case that the load 9 is implemented by the cold cathode tube, a brightness B of the cold cathode tube becomes unstable as shown by a line N in FIG. 7.

Figure 6:
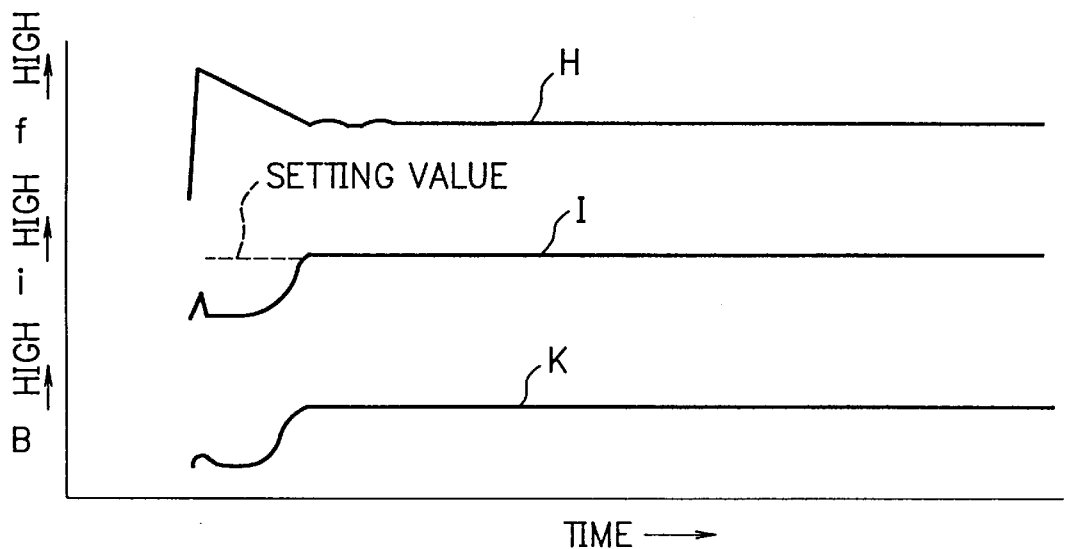
FIG. 6 is a fifth view for use in describing the operation of the conventional piezoelectric transformer driving circuit illustrated in FIG. 1.
Figure 7:
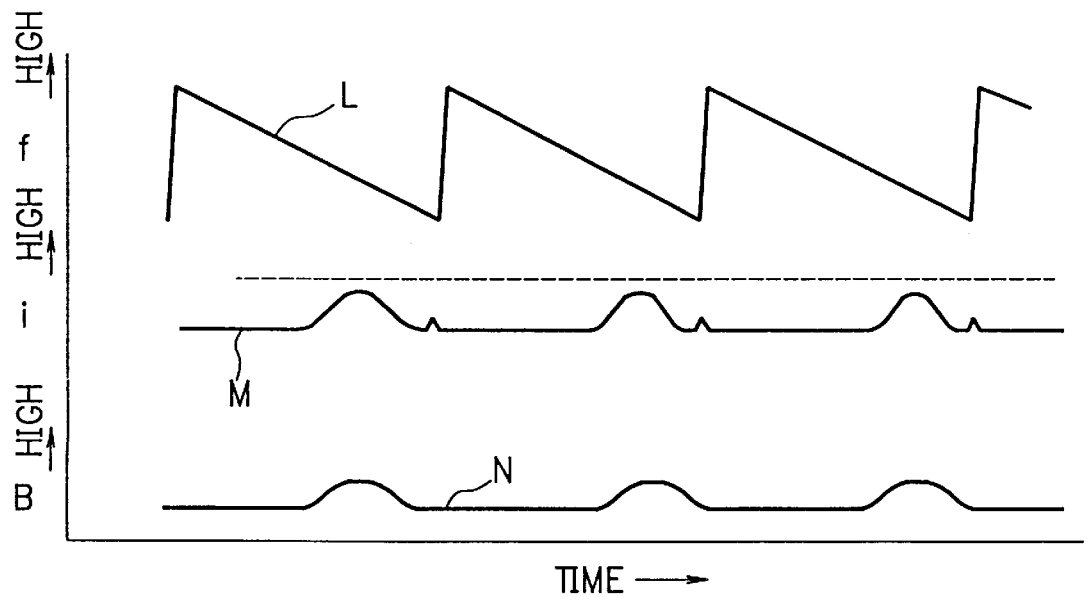
FIG. 7 is a sixth view for use in describing the operation of the conventional piezoelectric transformer driving circuit illustrated in FIG. 1.

In addition, the lines H, I, and K of FIG. 6 show changes of the driving frequency f, the load alternating current i, and the brightness B of the cold cathode tube in case that the load alternating current i reaches at the setting value. Lines L, M, and N of FIG. 7 show changes of the driving frequency f, the load alternating current i, and the brightness of the cold cathode tube in case that the load current i does not reach at the setting value because the input direct current voltage Vcc is lower than the minimum voltage Vcc1 which is determined by the setting value of the load alternating current i. Also, a line 0 of FIG. 8 shows a change of the brightness of the cold cathode tube that corresponds to the input direct current voltage Vcc in case that the load 9 is implemented by the cold cathode tube.

Therefore, when, in the above mentioned conventional piezoelectric transformer driving circuit, the direct current power source 1 is consumable, the input direct current voltage Vcc which makes the load 9 such as the cold cathode tube flow the setting of the load alternating current i falls short. As a result, the load alternating current i becomes unstable.

Figure 8:
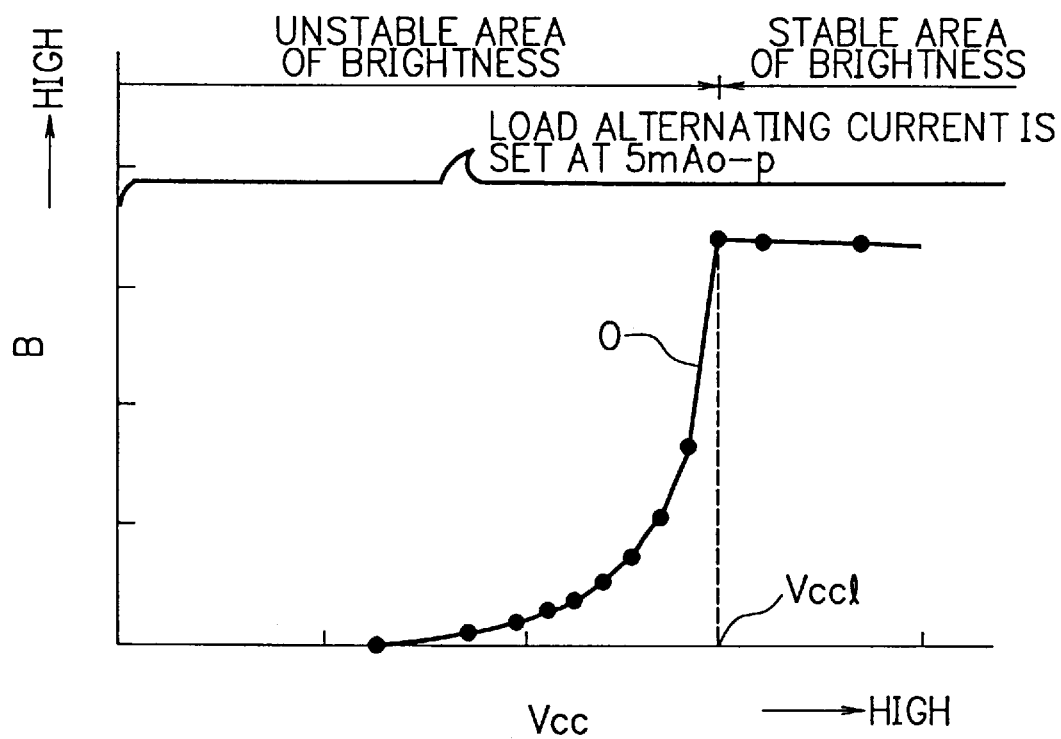
FIG. 8 is a seventh view for use in describing the operation of the conventional piezoelectric transformer driving circuit illustrated in FIG. 1.

For example, as shown in FIG. 8, when the input direct current voltage Vcc is equal to the minimum voltage Vcc1 which is determined by the setting value of the load alternating current i, the brightness of the cold cathode tube falls remarkably short. This is because the setting value of the load alternating current i is set at a constant value regardless of the input direct current voltage Vcc. Therefore, the scanning operation of the driving frequency f is repeated and the load alternating current i increases or decreases even when the setting value of the load alternating current i is not obtained because the input direct current voltage Vcc falls short.

Referring to FIGS. 9 to 14, the description will proceed to a piezoelectric transformer driving circuit according to a first embodiment of this invention. Similar parts are designated by like reference numerals.

Figure 9:
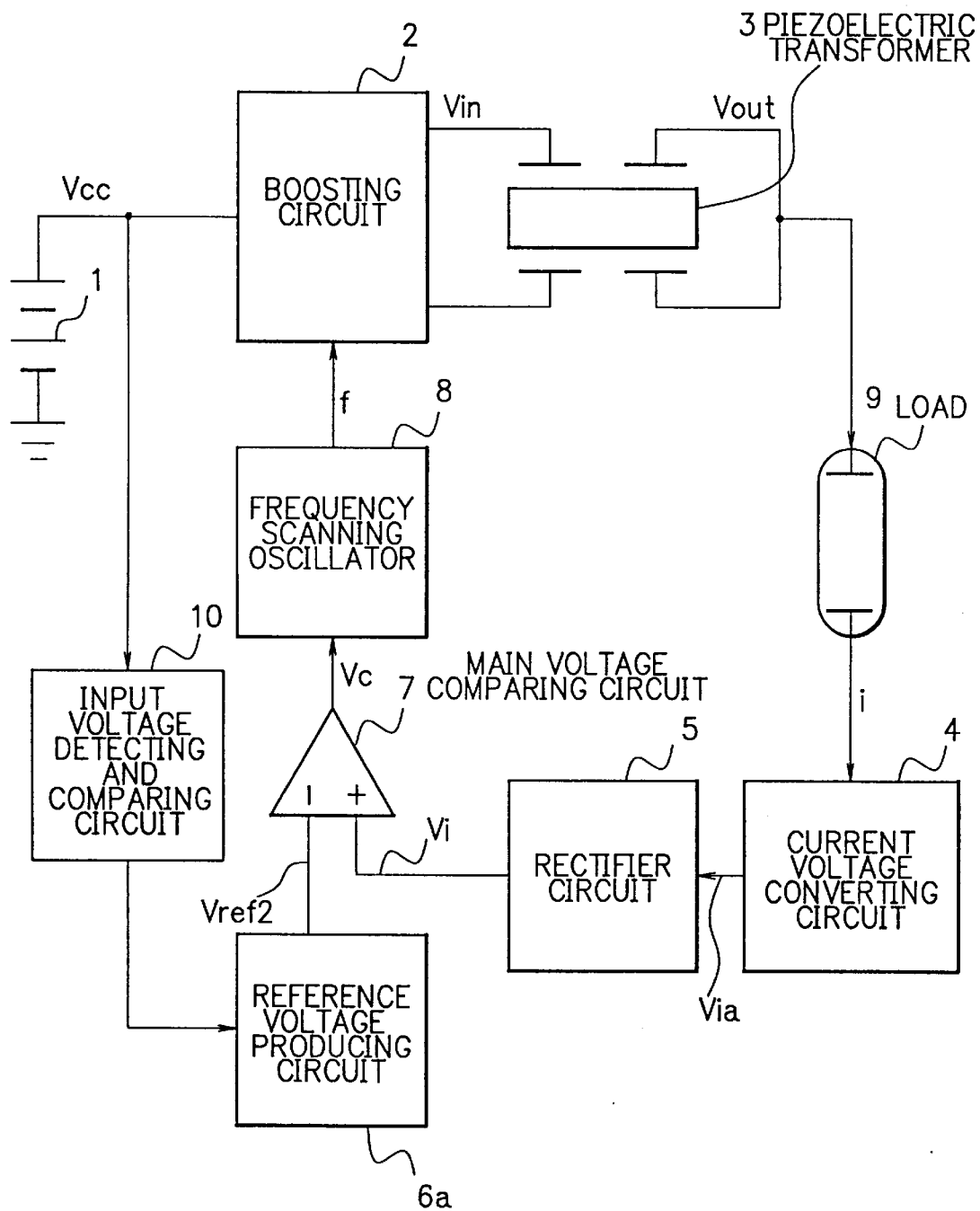
FIG. 9 is a block diagram of a piezoelectric transformer driving circuit according to a first embodiment of this invention.

In FIG. 9, the piezoelectric transformer driving circuit comprises the direct current power source 1, the boosting circuit 2, the piezoelectric transformer 3, the current voltage converting circuit 4, the rectifier circuit 5, a reference voltage producing circuit 6a, the main voltage comparing circuit 7, and the frequency scanning oscillator 8, and an input voltage detecting and comparing circuit 10. The reference voltage producing circuit 6a is connected to the input terminal of the main voltage comparing circuit 7. The input voltage detecting and comparing circuit 10 is connected between the direct current power source 1 and the reference voltage producing circuit 6a.

Figure 10:
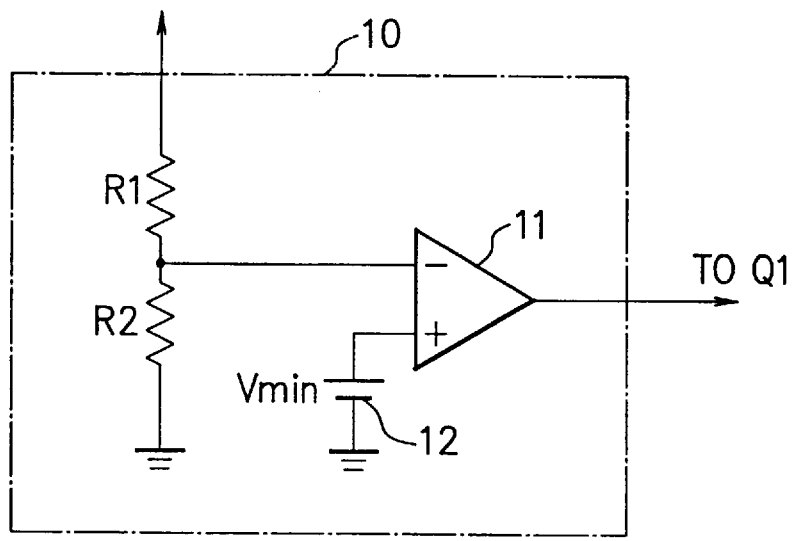
FIG. 10 is a circuit diagram of an input voltage detecting and comparing circuit of the piezoelectric transformer driving circuit illustrated in FIG. 9.

In FIG. 10, the input voltage detecting and comparing circuit 10 comprises two resistors R1 and R2, a comparator 11, and a direct current power source 12. The resistors R1 and R2 are directly connected between the direct current power source 1 and the ground. A negative input terminal of the comparator 11 is connected to a node of the resistors R1 and R2. A positive input terminal of the comparator 11 is connected to the direct current power source 12. The direct current power source 12 supplies the direct current voltage Vmin to the positive input terminal of the comparator 11. The input direct current voltage Vcc is divided by the resistors R1 and R2. A partial voltage Vcc (1+R1/R2) is supplied to the negative input terminal of the comparator 11. When the partial voltage Vcc/(1+R1/R2) is lower than the direct current voltage Vmin, the comparator 11 produces a first voltage having a high level. Also, when the partial voltage Vcc/(1+R1/R2) is higher than the direct current voltage Vmin, the comparator 11 produces a second voltage having a low level. In this event, the direct current voltage Vmin corresponds to a minimum voltage Vcc1 which is determined by the input direct current voltage Vcc, a partial voltage rate of the input direct current voltage Vcc, and the setting value of the load alternating current i.

Figure 11:
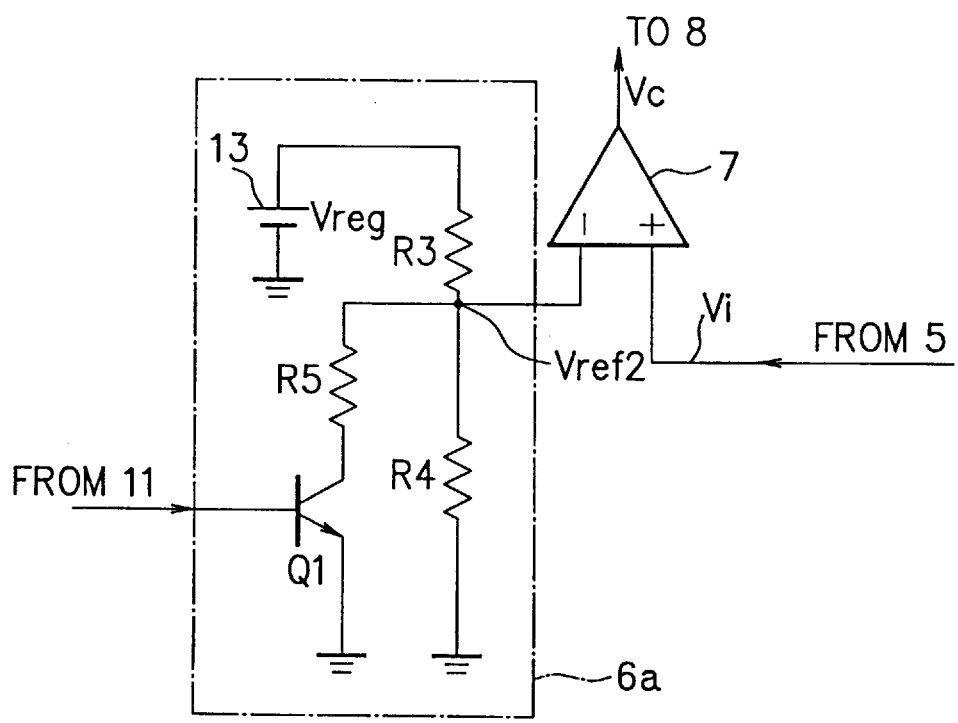
FIG. 11 is a circuit diagram of a reference voltage producing circuit of the piezoelectric transformer driving circuit illustrated in FIG. 9.

In FIG. 11, the reference voltage producing circuit 6a comprises resistors R3, R4, and R5, a direct current power source 13, and a transistor Q1. The resistors R3 and R4 are directly connected between the direct current power source 13 and the ground. The direct current power source 13 supplies a direct current voltage Vreg to the resistor R3. The resistor R5 is connected between the node of the resistors R3 and R4 and a collector electrode of the transistor Q1. A base electrode of the transistor Q1 is connected to an output terminal of the comparator 11. An emitter electrode of the transistor Q1 is connected to the ground. The node of the resistors R3 and R4 is connected to a negative input terminal of the main comparing circuit 7. One of the first and second voltages from the comparator 11 is supplied to the base electrode of the transistor Q1. When the base electrode of the transistor Q1 is supplied with the first voltage from the comparator 11, the transistor Q1 becomes ON. When the base electrode of the transistor Q1 is supplied with the second voltage from the comparator 11, the transistor Q1 becomes OFF.

When the transistor Q1 is OFF, a reference voltage Vref2a which is supplied to negative input terminal of the main comparing circuit 7 is represented by a following formula (1).

$$\text{Vref2}a = \text{Vreg}/(1 + R3/R4) \qquad (1)$$

When the transistor Q1 is ON, a reference voltage Vref2b which is supplied to negative input terminal of the main comparing circuit 7 is represented by a following formula (2).

$$\text{Vref2}b = \text{Vreg}/\{1 + R3(R4+R5)/(R4 R5)\} \qquad (2)$$

A following formula (3) is given by the formulas (1) and (2)

$$\text{Vref2}b < \text{Vref2}a \qquad (3)$$

It is assumed that a reference voltage which is supplied to negative input terminal of the main comparing circuit 7 is Vref2. When the partial voltage Vcc/(1+R1/R2) is higher than the direct current voltage Vmin, the transistor Q1 becomes OFF. As a result, the reference voltage Vref2 is equal to the reference voltage Vref2a. Also, when the partial voltage Vcc/(1+R1/R2) is lower than the direct current voltage Vmin, the transistor Q1 becomes ON. As a result, the reference voltage Vref2 is equal to the reference voltage Vref2b.

Also, the main voltage comparing circuit 7 is supplied with the rectified direct current voltage Vi from the rectifier circuit 5 and the reference voltage Vref2 from the reference voltage producing circuit 6a. The main voltage comparing circuit 7 compares the rectified direct current voltage Vi with the reference voltage Vref2 to produce the difference voltage Vc. The difference voltage Vc has the high level when the rectified direct current voltage Vi is lower than the reference voltage Vref2. Also, the difference voltage Vc has the low level when the rectified direct current voltage Vi is higher than the reference voltage Vref2.

Figure 12:
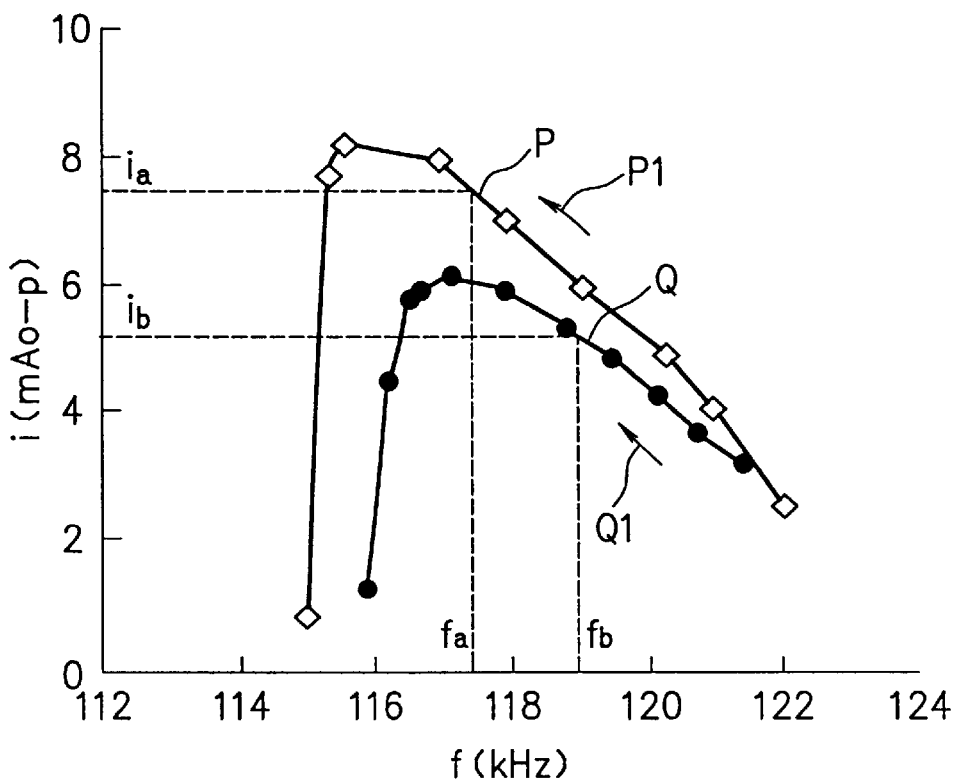
FIG. 12 is a first view for use in describing an operation of the piezoelectric transformer driving circuit illustrated in FIG. 9.

As shown in FIG. 12, when the difference voltage Vc has the high level, the frequency scanning oscillator 8 supplies the driving pulse signal having the driving frequency f to the boosting circuit 2 while the frequency scanning oscillator 8 scans, at the first predetermined rate, the driving frequency f in the low direction from the high value as shown by arrows P1 and Q1 in FIG. 12. In FIG. 12, a line P represents the load alternating current i when the input direct current voltage Vcc is higher than the minimum voltage Vcc1. Also, in FIG. 12, a line Q represents the load alternating current i when the input direct current voltage Vcc is lower than the minimum voltage Vcc1. When the rectified direct current voltage Vi is equal to the reference voltage Vref2, the frequency scanning oscillator 8 inverts the scanning direction, namely, the frequency scanning oscillator 8 supplies the driving pulse signal having the driving frequency f to the boosting circuit 2 while the frequency scanning oscillator 8 scans the driving frequency f in the high direction from the low value. Thereafter, the frequency scanning oscillator 8 repeats this operation to make the load alternating current i reach at the setting value.

Figure 13:
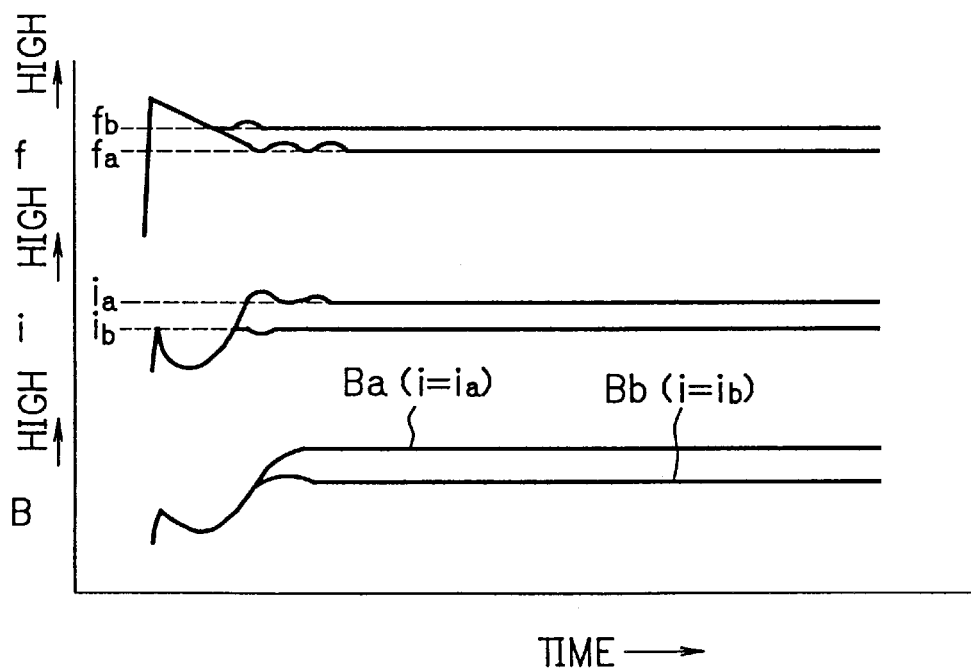
FIG. 13 is a second view for use in describing the operation of the piezoelectric transformer driving circuit illustrated in FIG. 9.

As shown in FIG. 13, when the input direct current voltage Vcc is higher than the minimum voltage Vcc1 which is determined by the setting value of the load alternating current i and when the load alternating current i flows in the load 9, the driving frequency f becomes a cistant value fa and the load alternating current i reaches to the setting value ia. As a result, the brightness Ba of the cold cathode tube as the load 9 becomes stabile. Also, when the input direct current voltage Vcc is lower than the minimum voltage Vcc1 which is determined by the setting value of the load alternating current i and when the load alternating current i flows in the load 9, the driving frequency f becomes a constant value fb (fb>fa) and the load alternating current i reaches to a new setting value ib (ib<ia). This is because the setting value of the load alternating current i is decreased. As a result, the brightness Bb (Bb<Ba) of the cold cathode tube as the load 9 becomes stabile.

Therefore, since the reference voltage Vref2 becomes low when the partial voltage Vcc/(1+R1/R2) is lower than the direct current voltage Vmin which is determined by the setting value of the load alternating current i, it is possible to prevent unstableness of the load alternating current i even when the input direct current voltage Vcc falls short. Also, as shown by a line R in FIG. 14, a stabile area of the brightness B of the cold cathode tube that corresponds to the input direct current voltage Vcc is spread to an area which corresponds to a voltage which is less than the minimum voltage Vcc1 that is determined by the setting value of the load alternating current i.

Referring to FIGS. 15 to 18, the description will proceed to a piezoelectric transformer driving circuit according to a second embodiment of this invention. Similar parts are designated by like reference numerals.

Figure 15:
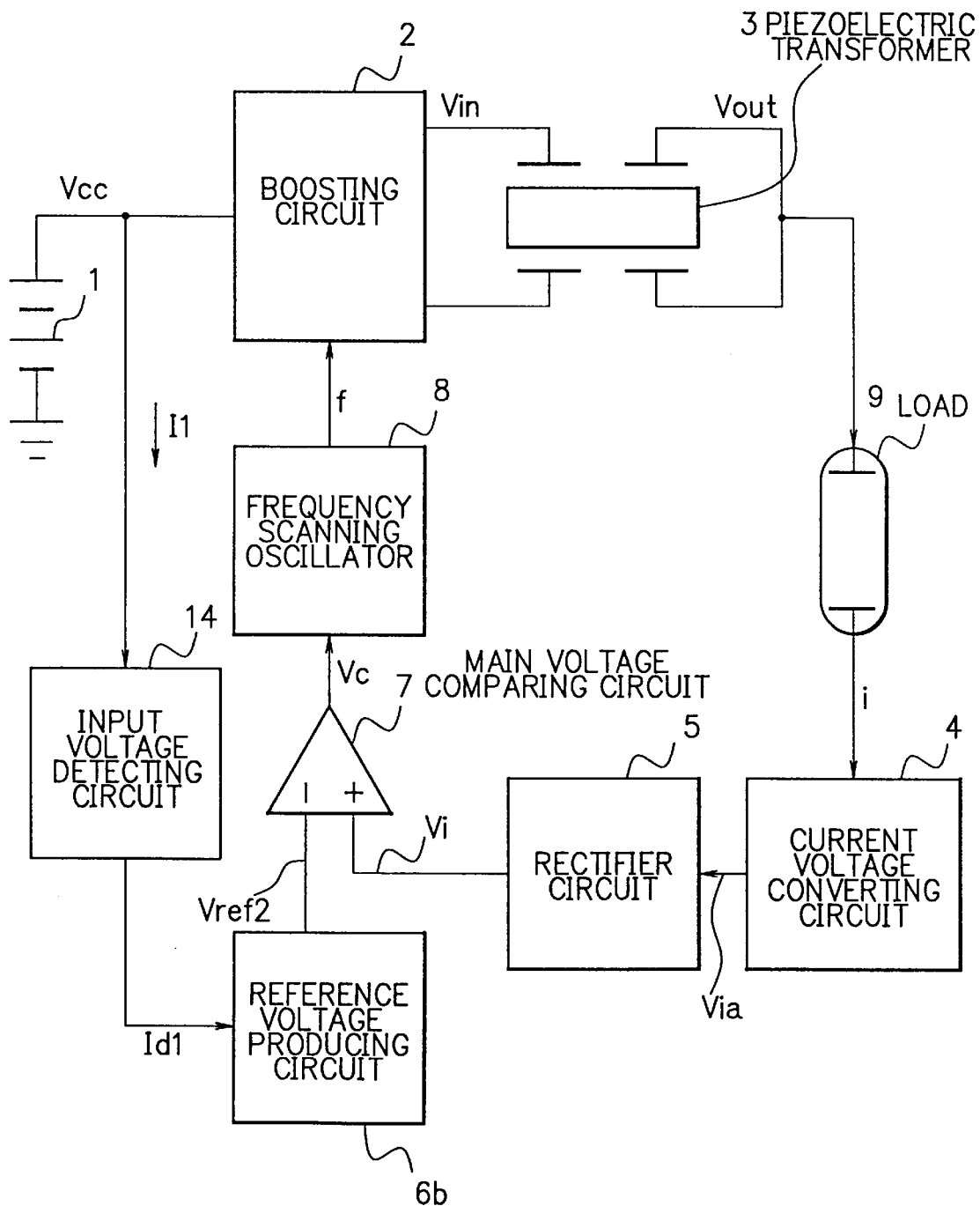
FIG. 15 is a block diagram of a piezoelectric transformer driving circuit according to a second embodiment of this invention.

In FIG. 15, the piezoelectric transformer driving circuit comprises the direct current power source 1, the boosting circuit 2, the piezoelectric transformer 3, the current voltage converting circuit 4, the rectifier circuit 5, a reference voltage producing circuit 6b, the main voltage comparing circuit 7, and the frequency scanning oscillator 8, and an input voltage detecting circuit 14. The reference voltage producing circuit 6b is connected to the input terminal of the main voltage comparing circuit 7. The input voltage detecting circuit 14 is connected between the direct current power source 1 and the reference voltage producing circuit 6b.

Figure 16:
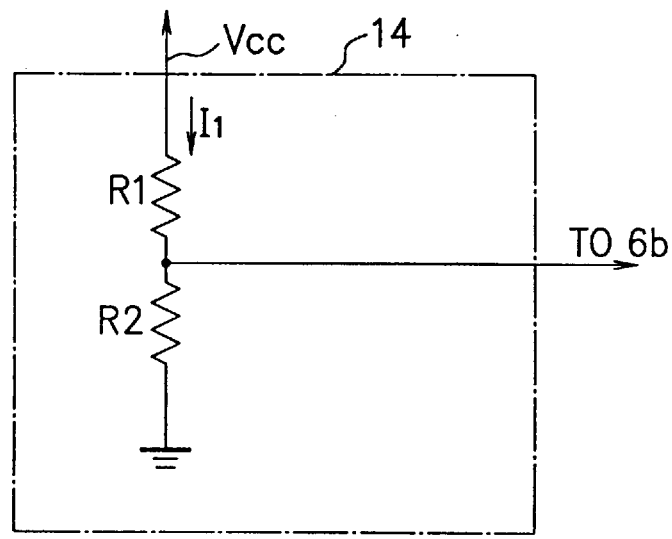
FIG. 16 is a circuit diagram of an input voltage detecting circuit of the piezoelectric transformer driving circuit illustrated in FIG. 15.

In FIG. 16, the input voltage detecting circuit 14 comprises the resistors R1 and R2. The resistors R1 and R2 are directly connected between the direct current power source 1 and the ground. The node of the resistors R1 and R2 is connected to the reference voltage producing circuit 6b. The input direct current voltage Vcc is divided by the resistors R1 and R2. A partial voltage Vcc/(1+R1/R2) of the node of the resistors R1 and R2 is supplied to the reference voltage producing circuit 6b.

Figure 17:
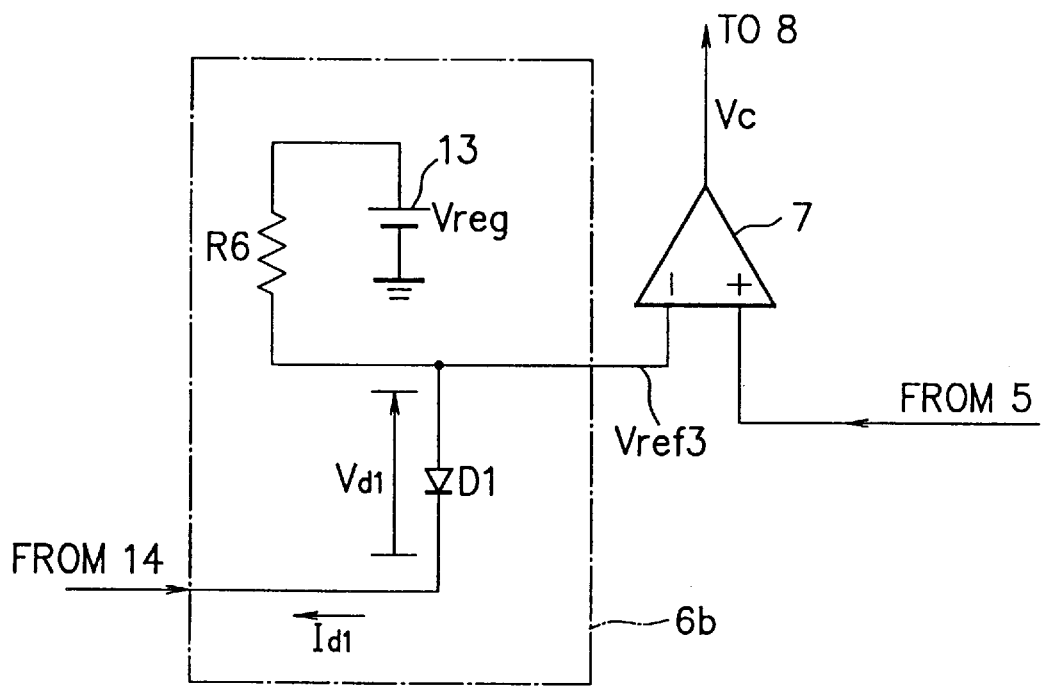
FIG. 17 is a circuit diagram of a reference voltage producing circuit of the piezoelectric transformer driving circuit illustrated in FIG. 15.
Figure 18:
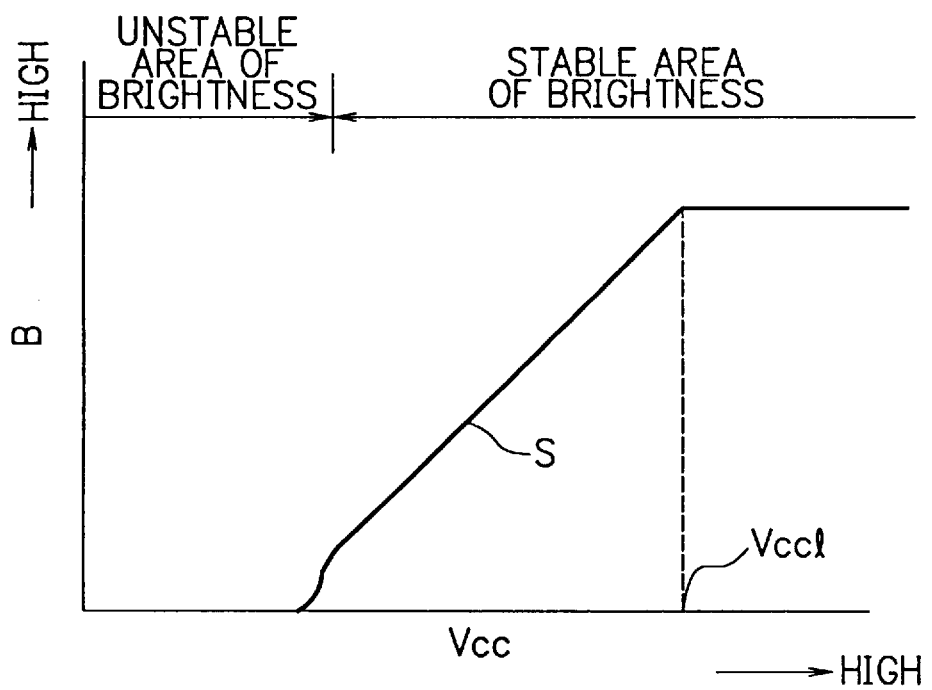
FIG. 18 is a view for use in describing an operation of the piezoelectric transformer driving circuit illustrated in FIG. 15.

In FIG. 17, the reference voltage producing circuit 6b comprises the direct current power source 13, a resistor R6, and a diode D1. The resistor R6 is connected between the direct current power source 13 and the negative input terminal of the main comparing circuit 7. The direct current power source 13 supplies the direct current voltage Vreg to the resistor R6. An anode of the diode D1 is connected to the negative input terminal of the main comparing circuit 7 and to the resistor R6. A cathode of the diode D1 is connected to the node of the resistors R1 and R2. The cathode of the diode D1 is supplied with the partial voltage Vcc/(1+R1/R2) from the input voltage detecting circuit 14.

It is assumed that a reference voltage which is supplied to the negative input terminal of the main comparing circuit 7 is Vref3. When the partial voltage Vcc/(1+R1/R2) is higher than a voltage Vcc1/(1+R1/R2), it is assumed that the Vref3 is Vref3a, the Vref3a is represented by a following formula (4).

$$\text{Vref3}a = \text{Vreg} \tag{4}$$

On the other hand, when the partial voltage Vcc/(1+R1/R2) is lower than the voltage Vcc1/(1+R1/R2), it is assumed that the Vref3 is Vref3b, the Vref3b is represented by a following formula (5).

$$\text{Vref3}b = Vd1 + \text{Vcc}/(1+R1/R2) \tag{5}$$

Here, Vd1 represents a forward direction voltage of the diode D1. Also, it is assumed that a current value in the resistors R1 and R2 is I1 and a forward direction current value in the diode D1 is Id1. Following formulas (6) and (7) are concluded.

$$Vd1 + \text{Vcc1}/(1+R1/R2) < \text{Vreg} \tag{6}$$

$$I1 >> Id1 \tag{7}$$

As shown in FIG. 13, when the input direct current voltage Vcc is higher than the minimum voltage Vcc1 which is determined by the setting value of the load alternating current i and when the load alternating current i flows in the load 9, the driving frequency f becomes the constant value fa and the load alternating current i reaches to the setting value ia. As a result, the brightness Ba of the cold cathode tube as the load 9 becomes stabile. Also, when the input direct current voltage Vcc is lower than the minimum voltage Vcc1 which is determined by the setting value of the load alternating current i and when the load alternating current i flows in the load 9, the driving frequency f becomes the constant value fb (fb>fa) and the load current i reaches to the new setting value ib (ib<ia). This is because the setting value of the load alternating current i is decreased. As a result, the brightness Bb (Bb<Ba) of the cold cathode tube as the load 9 becomes stabile.

Therefore, since the reference voltage Vref3 becomes low when the partial voltage Vcc/(1+R1/R2) is lower than the direct current voltage Vmin which is determined by the setting value of the load alternating current i, it is possible to prevent unstableness of the load alternating current i even when the input direct current voltage Vcc falls short. Also, as shown by a line S in FIG. 18, a stabile area of the brightness B of the cold cathode tube that corresponds to the input direct current voltage Vcc is spread to an area which corresponds to a voltage which is less than the minimum voltage Vcc1 that is determined by the setting value of the load alternating current i.

Figure 19:
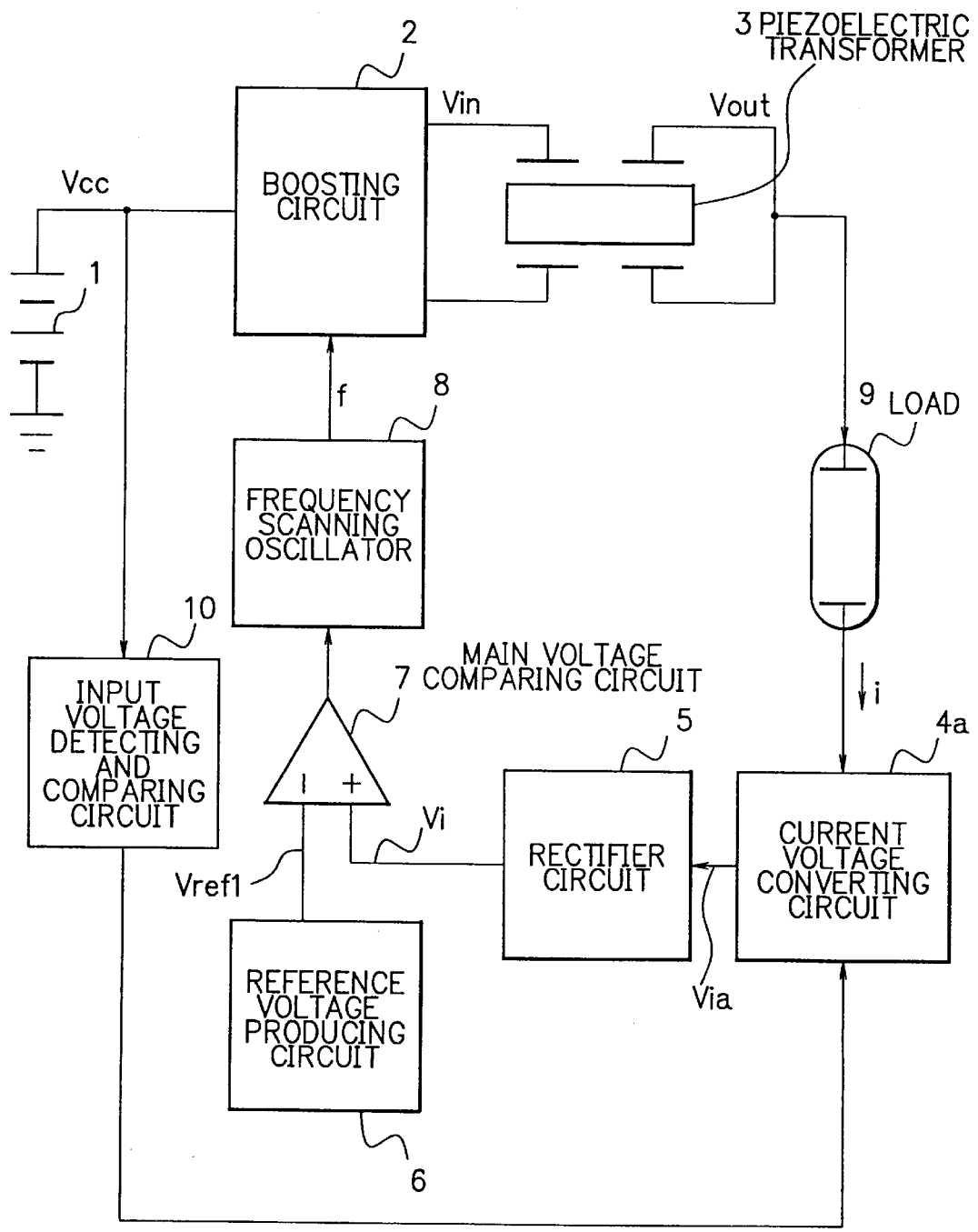
FIG. 19 is a block diagram of a piezoelectric transformer driving circuit according to a third embodiment of this invention.
Figure 20:
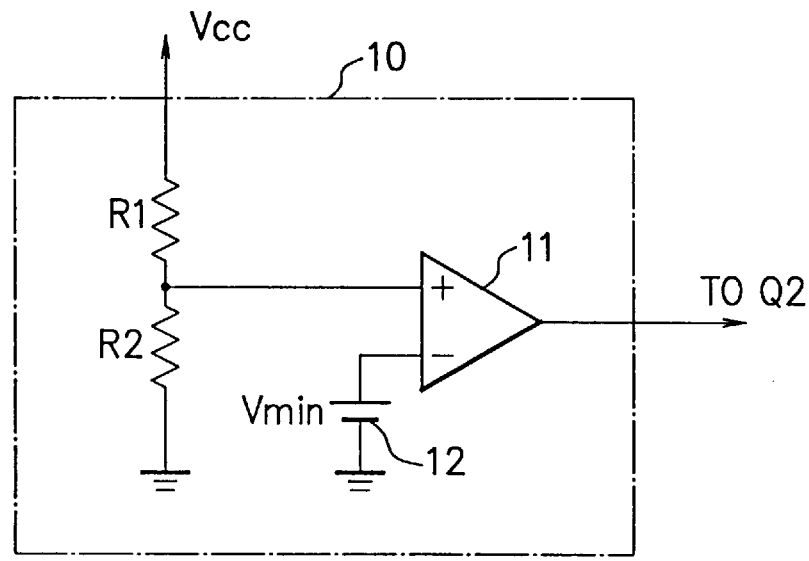
FIG. 20 is a circuit diagram of an input voltage detecting and comparing circuit of the piezoelectric transformer driving circuit illustrated in FIG. 19.
Figure 21:
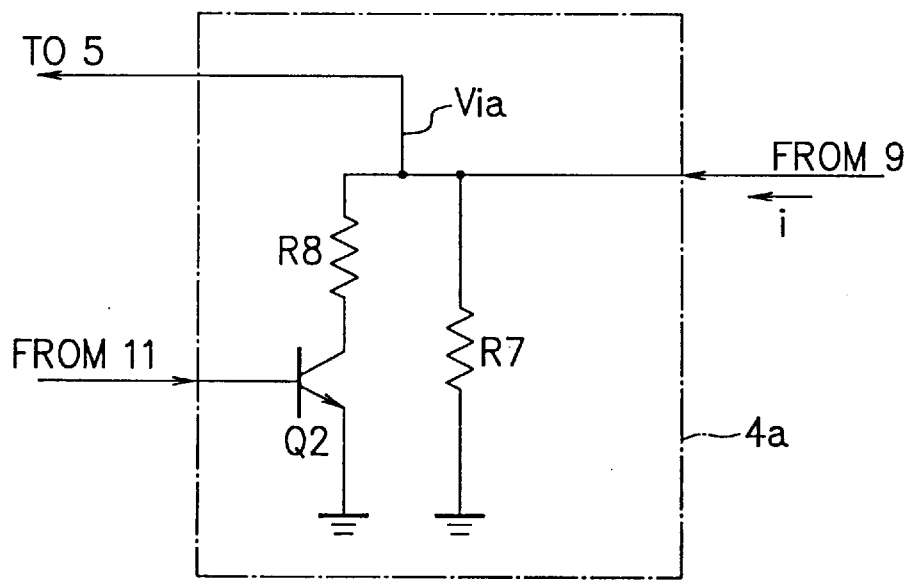
FIG. 21 is a circuit diagram of a current voltage converting circuit of the piezoelectric transformer driving circuit illustrated in FIG. 19.

Referring to FIGS. 19 to 21, the description will proceed to a piezoelectric transformer driving circuit according to a third embodiment of this invention. Similar parts are designated by like reference numerals.

In FIG. 19, the piezoelectric transformer driving circuit comprises the direct current power source 1, the boosting circuit 2, the piezoelectric transformer 3, a current voltage converting circuit 4a, the rectifier circuit 5, the reference voltage producing circuit 6, the main voltage comparing circuit 7, the frequency scanning oscillator 8, and the input voltage detecting and comparing circuit 10. The reference voltage producing circuit 6 is connected to the input terminal of the main voltage comparing circuit 7. The input voltage detecting and comparing circuit 10 is connected between the direct current power source 1 and the current voltage converting circuit 4a.

In FIG. 20, the input voltage detecting and comparing circuit 10 comprises the resistors R1 and R2, the comparator 11, and the direct current power source 12. The resistors R1 and R2 are directly connected between the direct current power source 1 and the ground. The positive input terminal of the comparator 11 is connected to the node of the resistors R1 and R2. The negative input terminal of the comparator 11 is connected to the direct current power source 12. The direct current power source 12 supplies the direct current voltage Vmin to the negative input terminal of the comparator 11. The input direct current voltage Vcc is divided by the resistors R1 and R2. The partial voltage Vcc/(1+R1/R2) is supplied to the positive input terminal of the comparator 11. When the partial voltage Vcc/(1+R1/R2) is higher than the direct current voltage Vmin, the comparator 11 produces the first voltage having the high level. Also, when the partial voltage Vcc/(1+R1/R2) is lower than the direct current voltage Vmin, the comparator 11 produces the second voltage having the low level. One of the first and second voltages from the comparator 11 is supplied to the current voltage converting circuit 4a.

In FIG. 21, the current voltage converting circuit 4a comprises resistors R7 and R8 and a transistor Q2. The resistor R7 is connected between the load 9 and the ground. The resistor R8 is connected between the resistor R7 and a collector electrode of the transistor Q2. A base electrode of the transistor Q2 is connected to an output terminal of the comparator 11. The base electrode of the transistor Q2 is supplied with the one of the first and second voltages from the comparator 11. An emitter electrode of the transistor Q2 is connected to the ground. A node of the resistors R7 and R8 is connected to the rectifier circuit 5.

When the base electrode of the transistor Q2 is supplied with the first voltage from the comparator 11, the transistor Q2 becomes ON. Also, when the base electrode of the transistor Q2 is supplied with the second voltage from the comparator 11, the transistor Q2 becomes OFF. Therefore, when the partial voltage Vcc/(1+R1/R2) is higher than the direct current voltage Vmin, the transistor Q2 becomes ON. Also, when the partial voltage Vcc/(1+R1/R2) is lower than the direct current voltage Vmin, the transistor Q2 becomes OFF.

It is assumed that the converted alternating current voltage Via is Via1 when partial voltage Vcc/(1+R1/R2) is higher than the direct current voltage Vmin. The Via1 is represented by a following formula (8).

$$Via1 = i \times R7 \times R8/(R7 \times R8) \tag{8}$$

It is assumed that the converted alternating current voltage Via is Via2 when the partial voltage Vcc/(1+R1/R2) is lower than the direct current voltage Vmin. The Via2 is represented by a following formula (9).

$$Via2 = i \times R7 \tag{9}$$

A following formula (10) is given by the formulas (8) and (9).

$$Via1 < Via2 \tag{10}$$

Figure 14:
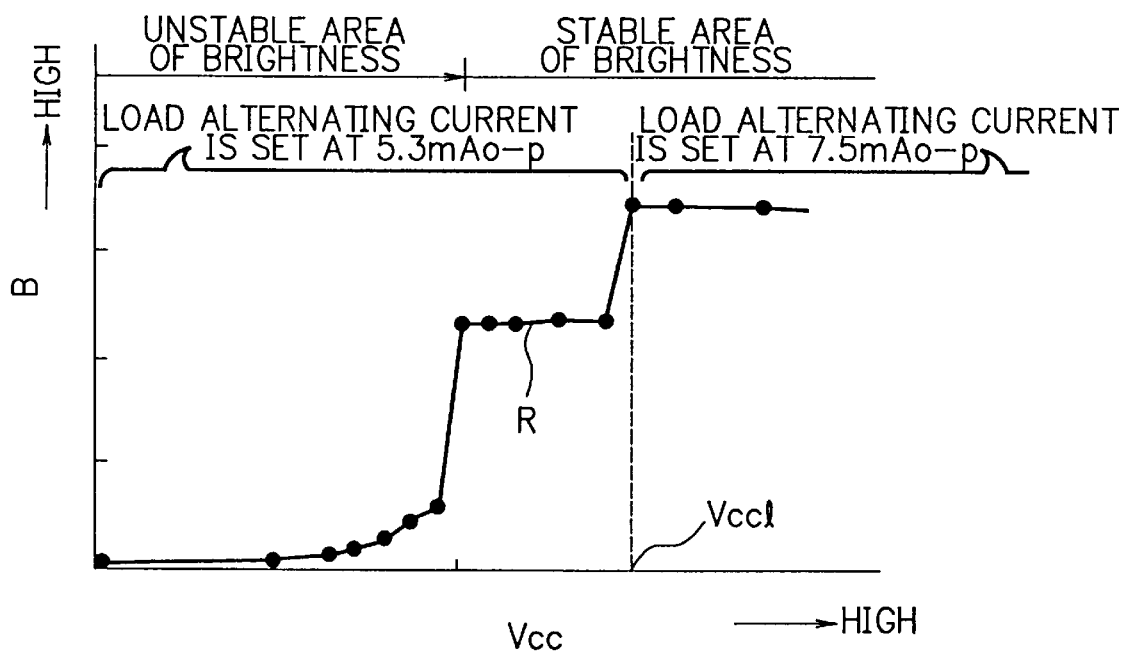
FIG. 14 is a third view for use in describing the operation of the piezoelectric transformer driving circuit illustrated in FIG. 9.

Therefore, the partial voltage Vcc/(1+R1/R2) is lower than the direct current voltage Vmin which is determined by the setting value of the load alternating current i, the reference voltage Vref1 is constant while the rectified direct current voltage Vi from the rectifier circuit 5 that is supplied to the positive input terminal of the main comparing circuit 7 becomes high. As a result, it is possible to prevent unstableness of the load alternating current i even when the input direct current voltage Vcc falls short. Also, as shown in FIG. 14, a stabile area of the brightness B of the cold cathode tube that corresponds to the input direct current voltage Vcc is spread to an area which corresponds to a voltage which is less than the minimum voltage Vcc1 that is determined by the setting value of the load alternating current i.

What is claimed is:

1. A piezoelectric transformer driving circuit comprising:

a boosting circuit supplied with an input direct current voltage for boosting said input direct current voltage to produce a boosted alternating current voltage;

a piezoelectric transformer supplied with said boosted alternating current voltage from said boosting circuit for supplying a transformed alternating current voltage to a load;

a current voltage converting circuit for converting a load alternating current which flows in said load to produce a converted alternating current voltage;

a rectifier circuit for rectifying said converted alternating current voltage from said current voltage converting circuit to produce a rectified direct current voltage;

an input voltage detecting circuit for detecting said input direct current voltage;

an input voltage comparing circuit for comparing said input direct current voltage with a minimum voltage which is determined by a setting value of said load alternating current to produce a first voltage having a high level when said input direct current voltage is lower than said minimum voltage and to produce a second voltage having a low level when said input direct current voltage is higher than said minimum voltage;

a reference voltage producing circuit for producing a first reference voltage having a high level when said reference voltage producing circuit is supplied with said second voltage from said input voltage comparing circuit and for producing a second reference voltage having a low level when said reference voltage producing circuit is supplied with said first voltage from said input voltage comparing circuit;

a main voltage comparing circuit for comparing said rectified direct current voltage from said rectifier circuit with one of said first and second reference voltages from said reference voltage producing circuit to produce a primary voltage having a high level when said rectified direct current voltage is lower than the one of said first and second reference voltages and to produce a secondary voltage having a low level when said rectified direct current voltage is higher than the one of said first and second reference voltages; and a frequency scanning oscillator for determining, in response to one of said primary and secondary voltages from said main voltage comparing circuit, a scanning direction of a driving frequency of a driving pulse signal which is supplied to said boosting circuit to supply said driving pulse signal to said boosting circuit.

2. A piezoelectric transformer driving circuit comprising:

a boosting circuit supplied with an input direct current voltage for boosting said input direct current voltage to produce a boosted alternating current voltage;

a piezoelectric transformer supplied with said boosted alternating current voltage from said boosting circuit for supplying a transformed alternating current voltage to a load;

a current voltage converting circuit for converting a load alternating current which flows in said load to produce a converted alternating current voltage;

a rectifier circuit for rectifying said converted alternating current voltage from said current voltage converting circuit to produce a rectified direct current voltage;

an input voltage detecting circuit for detecting said input direct current voltage;

a reference voltage producing circuit for producing a first reference voltage having a high-level when said input direct current voltage is higher than a minimum voltage which is determined by a setting value of said load alternating current and for producing a second reference voltage having a low level when said input direct current voltage is lower than said minimum voltage;

a main voltage comparing circuit for comparing said rectified direct current voltage from said rectifier circuit with one of said first and second reference voltages from said reference voltage producing circuit to produce a primary voltage having a high level when said rectified direct current voltage is lower than the one of said first and second reference voltages and to produce a secondary voltage having a low level when said rectified direct current voltage is higher than the one of said first and second reference voltages; and a frequency scanning oscillator for determining, in response to one of said primary and secondary voltages from said main voltage comparing circuit, a scanning direction of a driving frequency of a driving pulse signal which is supplied to said boosting circuit to supply said driving pulse signal to said boosting circuit.

3. A piezoelectric transformer driving circuit comprising:

a boosting circuit supplied with an input direct current voltage for boosting said input direct current voltage to produce a boosted alternating current voltage;

a piezoelectric transformer supplied with said boosted alternating current voltage from said boosting circuit for supplying a transformed alternating current voltage to a load;

an input voltage detecting circuit for detecting said input direct current voltage;

an input voltage comparing circuit for comparing said input direct current voltage with a minimum voltage which is determined by a setting value of said load alternating current to produce a first voltage having a high level when said input direct current voltage is higher than said minimum voltage and to produce a second voltage having a low level when said input direct current voltage is lower than said minimum voltage;

a current voltage converting circuit for converting a load alternating current which flows in said load to produce a first converted alternating current voltage having a high level when said current voltage converting circuit is supplied with said second voltage from said input voltage comparing circuit and for converting said load alternating current to produce a second converted alternating current voltage having a low level when said current voltage converting circuit is supplied with said first voltage from said input voltage comparing circuit;

a rectifier circuit for rectifying one of said first and second converted alternating current voltages from said current voltage converting circuit to produce one of first and second rectified direct current voltages, said first rectified direct current voltage having a high level, said second rectified direct current voltage having a low level;

a reference voltage producing circuit for producing a reference voltage;

a main voltage comparing circuit for comparing the one of said first and second rectified direct current voltages from said rectifier circuit with said reference voltage from said reference voltage producing circuit to produce a primary voltage having a high level when the one of said first and second rectified direct current voltages is lower than said reference voltage and to produce a secondary voltage having a low level when the one of said first and second rectified direct current voltages is higher than said reference voltage; and a frequency scanning oscillator for determining, in response to one of said primary and secondary voltages from said main voltage comparing circuit, a scanning direction of a driving frequency of a driving pulse signal which is supplied to said boosting circuit to supply said driving pulse signal to said boosting circuit.

4. A piezoelectric transformer driving method in which a piezoelectric transformer supplies a transformed alternating current voltage to a load to control a load alternating current in said load, said piezoelectric transformer driving method comprising:

a step of detecting an input direct current voltage which is supplied to a boosting circuit which supplies a boosted alternating current voltage to said piezoelectric transformer; and a step of decreasing a setting value of said load alternating current when said input direct current voltage is lower than a minimum voltage which is determined by said setting value of said load alternating current.

* * * * *

UNITED STATES PATENT AND TRADEMARK OFFICE
CERTIFICATE OF CORRECTION

PATENT NO. : 5,886,514
DATED : March 23, 1999
INVENTOR(S) : Kouichi IGUCHI and Hiroshi SASKI It is certified that error appears in the above-indentified patent and that said Letters Patent is hereby corrected as shown below:

Column 8, line 10, delete "Vcc (1 + R1/R2)" and insert --Vcc/(1 + R1/R2)--.

Column 12, line 12, delete "Vial = iXR7xR8(R7xR8)" and insert --Vial = iXR7xR8(R7 + R8)--.

Signed and Sealed this

Twelfth Day of October, 1999

Attest:

Q. TODD DICKINSON

*Attesting Officer*  *Acting Commissioner of Patents and Trademarks*